(12) United States Patent
Li et al.

(10) Patent No.: US 11,276,713 B2
(45) Date of Patent: Mar. 15, 2022

(54) ARRAY SUBSTRATE, MANUFACTURING METHOD, DISPLAY PANEL AND DISPLAY DEVICE THEREOF

(71) Applicants: Beijing BOE Technology Development Co., Ltd., Beijing (CN); BOE TECHNOLOGY GROUP CO., LTD., Beijing (CN)

(72) Inventors: Pan Li, Beijing (CN); Yong Qiao, Beijing (CN)

(73) Assignees: Beijing BOE Technology Development Co., Ltd., Beijing (CN); BOE Technology Group Co, , Ltd., Beijing (CN)

( * ) Notice: Subject to any disclaimer, the term of this patent is extended or adjusted under 35 U.S.C. 154(b) by 299 days.

(21) Appl. No.: 16/630,738

(22) PCT Filed: Apr. 4, 2019

(86) PCT No.: PCT/CN2019/081588
§ 371 (c)(1),
(2) Date: Jan. 13, 2020

(87) PCT Pub. No.: WO2019/218799
PCT Pub. Date: Nov. 21, 2019

(65) Prior Publication Data
US 2021/0013233 A1 Jan. 14, 2021

(30) Foreign Application Priority Data
May 14, 2018 (CN) .......................... 201820712571.1

(51) Int. Cl.
*H01L 27/12* (2006.01)
(52) U.S. Cl.
CPC .......... *H01L 27/124* (2013.01); *H01L 27/127* (2013.01)

(58) Field of Classification Search
None
See application file for complete search history.

(56) References Cited

U.S. PATENT DOCUMENTS

| 8,587,511 B2 | 11/2013 | Park et al. |
| 2017/0038654 A1 | 2/2017 | Cheng et al. |
| | (Continued) | |

FOREIGN PATENT DOCUMENTS

| CN | 202693965 U | 1/2013 |
| CN | 105607361 A | 5/2016 |
| | (Continued) | |

OTHER PUBLICATIONS

First Office Action issued in Indian Application No. 201927052697 dated Nov. 25, 2020, (7p).

(Continued)

*Primary Examiner* — Evren Seven
(74) *Attorney, Agent, or Firm* — Arch & Lake LLP

(57) ABSTRACT

Arrangements disclosed in the present disclosure provide an array substrate, a manufacturing, a display panel and a display device. The array substrate comprises: a first signal line comprising a first extension portion along a first direction and a first connection portion along a second direction, which is provided with via holes; a second signal line comprising a second extension portion and a second connection portion along the second direction, which is provided with via holes; and a conductive connection layer, configured to connect the first signal line and the second signal line through the via holes of the first connection portion and second connection portion. The first connection portion and the second connection portion are lined up in a direction perpendicular to the second direction.

20 Claims, 7 Drawing Sheets

(56) References Cited

U.S. PATENT DOCUMENTS

2018/0070039 A1* 3/2018 Ling ................. H04N 5/35572
2019/0018526 A1* 1/2019 Fu ........................ G09G 3/3275

FOREIGN PATENT DOCUMENTS

| CN | 106125437 A | 11/2016 |
| CN | 107479283 A | 12/2017 |
| CN | 208488633 U | 2/2019 |
| JP | H07-175038 A | 7/1995 |
| JP | 3050738 B2 | 6/2000 |
| JP | 2016-224296 A | 12/2016 |
| KR | 0153222 B1 | 11/1998 |
| KR | 20080008703 A | 1/2008 |
| KR | 20080036747 A * | 4/2008 |
| TW | 263580 B | 11/1995 |

OTHER PUBLICATIONS

International Search Report and Written Opinion dated Jun. 17, 2019, from application No. PCT/CN2019/081588.

* cited by examiner

ARRAY SUBSTRATE, MANUFACTURING METHOD, DISPLAY PANEL AND DISPLAY DEVICE THEREOF

CROSS-REFERENCE TO RELATED APPLICATIONS

This application is based upon International Application No. PCT/CN2019/081588, filed on Apr. 4, 2019, which claims priority to Chinese Application No. 201820712571.1, filed May 14, 2018 and entitled "ARRAY SUBSTRATE, DISPLAY PANEL, AND DISPLAY DEVICE", the entire contents of which are herein incorporated by reference in its entirety.

TECHNICAL FIELD

The present disclosure relates to display technologies, and more particularly, to an array substrate, a method for manufacturing the array substrate, a display panel using the array substrate, and a display device using the array substrate.

BACKGROUND

With the industrial progress and improvement of processes of thin film transistors, liquid crystal display devices have been applied to more and more panel display products such as mobile phones, digital cameras, tablet computers, notebook computers and LCD TVs, and their excellent display characteristics have been highly praised by more and more users and their market competitiveness is strong.

A Thin Film Transistor Liquid Crystal Display (TFT LCD) is a display device with a wide size range, low energy consumption and low radiation. A thin film transistor liquid crystal display panel is generally composed of an array substrate (a substrate on which thin film transistors (TFT) are formed), a Color Filter (CF) and a liquid crystal layer filled in a cell gap formed by aligning the above two.

In an array substrate, there are usually a variety of signal lines. The signal lines are usually connected to a binding region through corresponding signal lead-out lines in a peripheral region of the substrate.

The foregoing information disclosed in Background are only for better understanding of the background of the present disclosure and therefore it can include information that does not constitute the relevant technology already known to those of ordinary skill in the art.

SUMMARY

Other features and advantages of the present disclosure will be apparent from the following detailed descriptions.

According to a first aspect of the present disclosure, there is provided an array substrate. The array substrate includes a first signal line including a first extension portion in a first direction and a first connection portion in a second direction. The first connection portion is provided with via holes. The array substrate includes a second signal line including a second extension portion and a second connection portion in the second direction. The second connection portion is provided with via holes. The array substrate includes a conductive connection layer configured to connect the first signal line and the second signal line through the via holes of the first connection portion and the via holes of the second connection portion. The first connection portion and the second connection portion are lined up in a direction perpendicular to the second direction.

According to an arrangement of the present disclosure, a sum of widths of the first connection portion and the second connection portion is not greater than a width of the second extension portion.

According to an arrangement of the present disclosure, an engaging structure is formed between the first connection portion and the second connection portion.

According to an arrangement of the present disclosure, a shape of a neighboring boundary between the first connection portion and the second connection portion is any one or more of a square wave shape, a zigzag shape, an arc shape and an irregular shape.

According to an arrangement of the present disclosure, the first signal line further includes a third connection portion in the first direction, and the third connection portion is provided with via holes. The second signal line further includes a fourth connection portion in the first direction, and the fourth connection portion is provided with via holes. The conductive connection layer is further configured to connect the first signal line and the second signal line through the via holes of the third connection portion and the via holes of the fourth connection portion. The third connection portion and the fourth connection portion are lined up in a direction perpendicular to the first direction.

According to an arrangement of the present disclosure, a sum of widths of the third connection portion and the fourth connection portion is not greater than a width of the first extension portion.

According to an arrangement of the present disclosure, an engaging structure is formed between the third connection portion and the fourth connection portion.

According to an arrangement of the present disclosure, a shape of a neighboring boundary between the third connection portion and the fourth connection portion is any one or more of a square wave shape, a zigzag shape, an arc shape and an irregular shape.

According to an arrangement of the present disclosure, the first signal line is a signal line in the array substrate and the second signal line is a signal lead-out line of the corresponding signal line, or the second signal line is a signal line in the array substrate and the first signal line is a signal lead-out line of the corresponding signal line.

According to an arrangement of the present disclosure, the signal lines includes any one of a gate line, a data line, a common electrode line, a clock signal line and a touch line.

According to an arrangement of the present disclosure, the first direction is perpendicular to the second direction.

According to a second aspect of the present disclosure, there is provided a display panel, including the array substrate according to any one of the above arrangements.

According to a second aspect of the present disclosure, there is provided a display device, including the display panel according to any one of the above arrangements.

According to a second aspect of the present disclosure, there is provided a method for manufacturing an array substrate. The method includes depositing a first metal layer on a substrate and forming a first signal line by the first metal layer. The first signal line includes a first extension portion in a first direction and a first connection portion in a second direction. The method includes depositing a first insulating layer on the first metal layer, depositing a second metal layer on the first insulating layer and forming a second signal line by the second metal layer. The second signal line includes a second extension portion and a second connection portion in the second direction. The method includes depositing a second insulating layer on the second metal layer. The method includes forming via holes of the first connection portion by penetrating the second insulating layer and the second metal layer and forming via holes of the second connection portion by penetrating the second insulating layer. The method includes depositing a conductive connection layer on the second insulating layer and forming a pattern of the conductive connection layer etching. The first signal line and the second signal line are connected through the via holes of the first connection portion and the via holes of the second connection portion in the pattern. The first connection portion and the second connection portion are lined up in a direction perpendicular to the second direction.

According to an arrangement of the present disclosure, a sum of widths of the first connection portion and the second connection portion is not greater than a width of the second extension portion.

According to an arrangement of the present disclosure, an engaging structure is formed between the first connection portion and the second connection portion.

According to an arrangement of the present disclosure, a shape of a neighboring boundary between the first connection portion and the second connection portion is any one or more of a square wave shape, a zigzag shape, an arc shape and an irregular shape.

According to an arrangement of the present disclosure, forming the first signal line further includes forming a third connection portion in the first direction, and third connection portion is provided with via holes; forming the second signal line further includes forming a fourth connection portion in the first direction, and the fourth connection portion is provided with via holes; forming the conductive connection layer further includes forming a pattern of the conductive connection layer by etching. The first signal line and the second signal line are connected through the via holes of the third connection portion and the via holes of the fourth connection portion in the pattern. The third connection portion and the fourth connection portion are lined up in a direction perpendicular to the first direction.

According to an arrangement of the present disclosure, a sum of widths of the third connection portion and the fourth connection portion is not greater than a width of the first extension portion.

According to an arrangement of the present disclosure, an engaging structure is formed between the third connection portion and the fourth connection portion.

It is to be understood that both the foregoing general description and the following detailed description are example and explanatory only and are not restrictive of the disclosure, as claimed.

BRIEF DESCRIPTION OF THE DRAWINGS

The accompanying drawings, which are incorporated in and constitute a part of this specification, illustrate arrangements consistent with the disclosure and, together with the description, serve to explain the principles of the disclosure.

DETAILED DESCRIPTION

Figure 1:
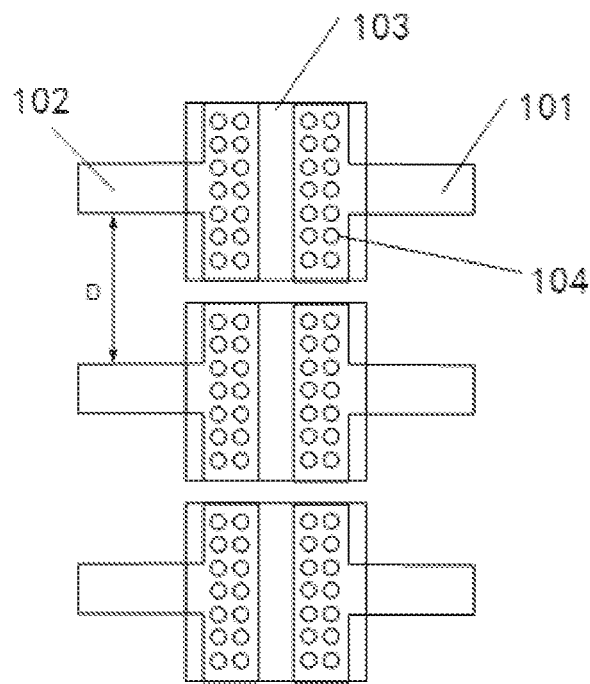
FIG. 1 is a view schematically illustrating an array substrate in prior art.

The example implementations will now be described more fully with reference to the accompanying drawings. Example arrangements can be embodied in many forms, and should not be construed as being limited to the examples set forth herein; rather, the implementations are provided so that the disclosure will be thorough and complete, and will fully convey the conception of example implementations to those skilled in the art. The drawings are only schematic representations of the disclosure, and are not necessarily drawn to scale. The same reference numerals throughout the drawings denote the same or like parts, thus their detailed description will be omitted.

In addition, the features, structures or characteristics described herein can be included in one or more arrangements in any appropriate way. In the description hereinafter, many specific details are provided for fully understanding of the arrangements of the present disclosure. However, it will be appreciated by those skilled in the art that the technical solution of the present disclosure can be practiced without one or more of the specific details, or with other methods, components, devices or blocks. In addition, known structures, methods, devices, implementations, materials or operations will not be illustrated or described in detail, to avoid obscuration of the aspects of the present disclosure.

Some of the block diagrams shown in the drawings are functional entities and are not necessarily corresponding to physically or logically separate entities. These functional entities may be implemented in software, or implemented in one or more hardware modules or integrated circuits, or implemented in different network and/or processor devices and/or microcontroller devices.

The implementations set forth in the following description of example arrangements do not represent all implementations consistent with the disclosure. Instead, they are merely examples of devices and methods consistent with aspects related to the disclosure as recited in the appended claims.

FIG. 1 is a view schematically illustrating an array substrate in prior art.

In an array substrate, there are generally many kinds of signal lines 102 which are usually connected to a binding region through corresponding signal lead-out lines 101 in a peripheral region of the substrate. The signal lines 102 and their respective signal lead-out lines 101 are not in direct connections for some design reasons (such as but not limited to, the signal lines 102 and their respective signal lead-out lines 101 are disposed on different layers, or for anti-static purpose, etc.). Rather, the signal lines 102 and their respective signal lead-out lines 101 are lapped by adding a conductive connection layer 103, and are connected through their via holes 104. For example, the connection manner of the signal lines and the signal lead-out lines in the relevant technology is as illustrated in FIG. 1.

To reduce an impedance of a lapping region, a width of the conductive connection layer will be generally increased to realize the purpose of reducing the impedance. However, such design may lead a space D between the adjacent signal lines to be increased, which is disadvantageous for wiring of the peripheral region, and thus disadvantageous for realizing a narrow frame of a display panel.

Figure 2:
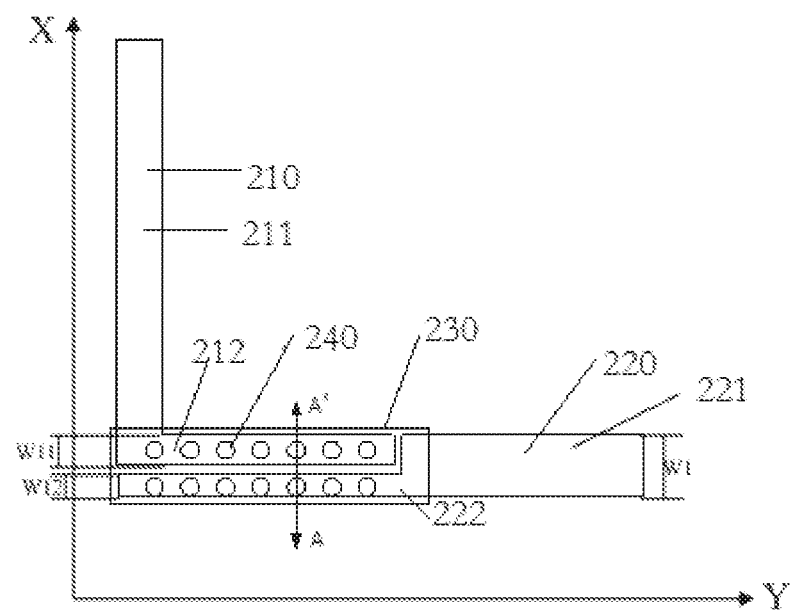
FIG. 2 is a view schematically illustrating an array substrate according to an example arrangement of the present disclosure.

FIG. 2 is a view schematically illustrating an array substrate according to an example arrangement of the present disclosure.

As illustrated in FIG. 2, arrangements of the present disclosure provide an array substrate. The array substrate can include a first signal line 210, a second signal line 220 and a conductive connection layer 230.

The first signal line 210 can include a first extension portion 211 in a first direction (e.g. an X-axis direction in the figure, but the present disclosure is not limited thereto) and a first connection portion 212 in a second direction (e.g. a Y-axis direction in the figure, but the present disclosure is not limited thereto). In the arrangement, via holes 240 can be disposed in the first connection portion 212.

The second signal line 220 can include a second extension portion 221 and a second connection portion 222 in the second direction. In the arrangement, via holes 240 can be disposed in the second connection portion 222.

The conductive connection layer 230 can be configured to connect the first signal line 210 and the second signal line 220 through the via holes 240 of the first connection portion 212 and the via holes 240 of the second connection portion 222.

The first connection portion 212 and the second connection portion 222 are lined up in a direction substantially perpendicular to the second direction.

In the arrangement illustrated in FIG. 2, the first direction can be perpendicular to the second direction. At this time, the first connection portion 212 of the first signal line 210 and the second connection portion 222 of the second signal line 220 are lined up in the first direction. A number of via holes 240 are respectively disposed on the first connection portion 212 and the second connection portion 222.

In an example arrangement, a sum of a width W11 of the first connection portion 212 and a width W12 of the second connection portion 222 is not greater than a width W1 of the second extension portion 221.

It should be noted that "width" in the arrangement refers to a width in a direction perpendicular to an extension direction of the second signal line 220.

In an example arrangement, an engaging structure is formed between the first connection portion 212 and the second connection portion 222.

In the arrangement illustrated in FIG. 2, the sum of the widths of the first connection portion 212 and the second connection portion 222 is approximately equal to the width of the second extension portion 221, and the engaging structure is formed between the first connection portion 212 and the second connection portion 222. Therefore, on one hand, the impedance of the lapping region can be reduced to realize the purpose of reducing the impedance; on the other hand, the space D' (shown in FIG. 4) between two adjacent second signal lines (e.g., adjacent second signal lines 410 and 420) can be further decreased, such that the wiring of the second signal lines can be more compact, which is beneficial for the implementation of the narrow frame of the display panel.

It is to be understood that the sum of the widths of the first connection portion 212 and the second connection portion 222 may be smaller than the width of the second extension portion 221 in other arrangements; or the sum of the widths of the first connection portion 212 and the second connection portion 222 may be greater than the width of the second extension portion 221, which is not limited in the present disclosure.

In the arrangement illustrated in FIG. 2, the first connection portion 212 is disposed on a first side (e.g. above the second connection portion 222 in the figure) of the second connection portion 222. In other arrangements, the first connection portion 212 may be disposed on a second side of the second connection portion 222 (e.g. below the second connection portion 222) as well, which is not limited in the present disclosure.

In the arrangement illustrated in FIG. 2, the second signal line 220 can be any kind of signal line in the array substrate, and the first signal line 210 can be a signal lead-out line corresponding to that kind of signal line.

In an example arrangement, the signal lines can include any one of a gate line, a data line, a common electrode line, or a clock signal line in the array substrate.

In an example arrangement, if the array substrate is an array substrate that is integrated with in-plane touch control, the signal lines can further include a touch line.

In other arrangements, the first signal line 210 can be any kind of signal line in the array substrate and the second signal line 220 can be a signal lead-out line corresponding to that kind of signal line as well.

In the array substrate provided by the arrangement of the present disclosure, through the first extension portion in the first direction and the first connection portion in the second direction of the first signal line, the second extension portion and the second connection portion in the second direction of the second signal line, and by lining up the first connection portion and the second connection portion in the direction perpendicular to the second direction, it is possible to reduce the space between the adjacent signal lines of the array substrate when the signal lines and their corresponding signal lead-out lines are connected using the conductive connection layers, such that the wiring of the signal lines of the array substrate can be more compact, which is beneficial for the implementation of the narrow frame of the display panel.

Figure 3:
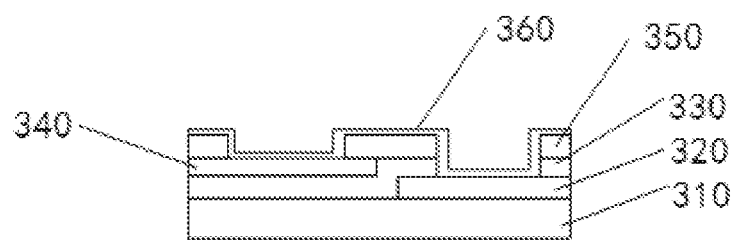
FIG. 3 is a view schematically illustrating a cross-sectional structure of the array substrate illustrated in FIG. 2.

FIG. 3 is a view schematically illustrating a cross-sectional structure of the array substrate illustrated in FIG. 2.

FIG. 3 is a cross-sectional view illustrating the array substrate AA' illustrated in FIG. 2. Here, explanations will be made by taking an example in which the second signal line is a signal line 340 of the array substrate and the first signal line is a signal lead-out line 320 of the corresponding signal line.

In an arrangement of the present disclosure, the array substrate can include: a substrate 310; a signal lead-out line 320 disposed on the substrate 310; a first insulating layer 330 disposed on the signal lead-out line 320; a signal line 340 disposed on the first insulating layer 330; a second insulating layer 350 disposed on the signal line 340; and a conductive connection layer 360 disposed on the second insulating layer 350.

Figure 7:
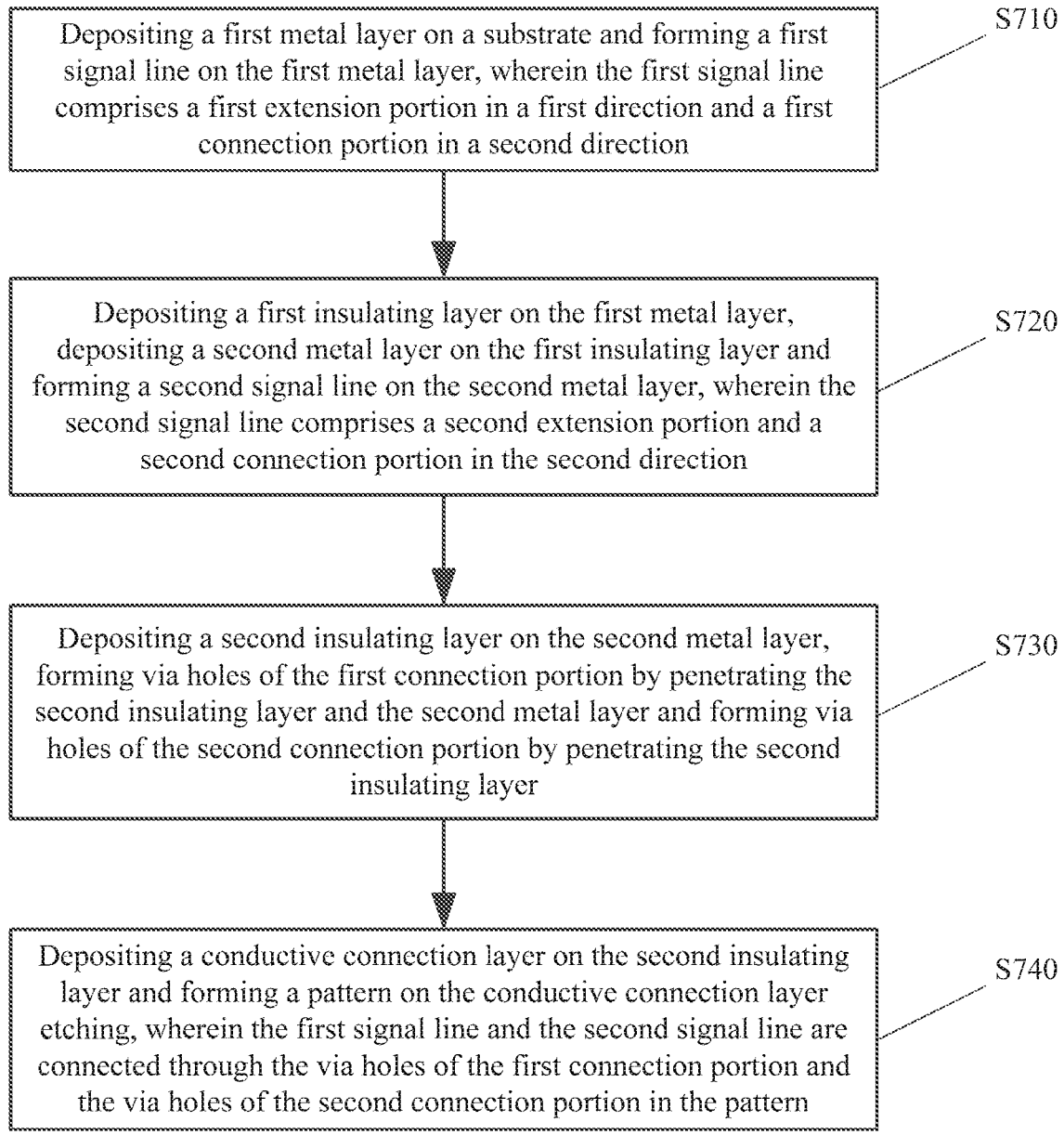
FIG. 7 is a flow chart schematically illustrating a method of manufacturing an array substrate according to an example arrangement of the present disclosure.

The disclosure further provides a method for manufacturing the above array substrate. FIG. 7 is a flow chart schematically illustrating a method of manufacturing an array substrate according to an example arrangement of the present disclosure. As shown in FIG. 7, the method includes:

Block S710, depositing a first metal layer on a substrate and forming a first signal line by the first metal layer. The first signal line includes a first extension portion in a first direction and a first connection portion in a second direction;

Block S720, depositing a first insulating layer on the first metal layer, depositing a second metal layer on the first insulating layer and forming a second signal line by the second metal layer. The second signal line includes a second extension portion and a second connection portion in the second direction;

Block S730, depositing a second insulating layer on the second metal layer, forming via holes of the first connection portion by penetrating the second insulating layer and the second metal layer and forming via holes of the second connection portion by penetrating the second insulating layer; and Block S740, depositing a conductive connection layer on the second insulating layer and forming a pattern of the conductive connection layer etching. The first signal line and the second signal line are connected through the via holes of the first connection portion and the via holes of the second connection portion in the pattern. The first connection portion and the second connection portion are lined up in a direction perpendicular to the second direction.

For example, the above array substrate shown in FIG. 2 and FIG. 3 can be manufactured by the following process:

A first metal layer can be deposited on the substrate 310 by, for example, a sputtering process.

For another example, a pattern of the metal signal lead-out lines 320 can be formed by the first metal layer by a wet etching process.

The first insulating layer 330 can be deposited on the pattern of the metal signal lead-out lines 320, for example, by a chemical vapor deposition (CVD) process.

For another example, a second metal layer can be deposited on the first insulating layer 330 by a sputtering process.

For another example, a pattern of the signal lines 340 can be formed by the second metal layer by a wet etching process.

For another example, a second insulating layer 350 can be deposited on the formed pattern of the signal line 340 by a CVD process.

For another example, via holes in the signal line 340 and the signal lead-out line 320 can be formed by a dry etching process.

The conductive connection layer 360 is deposited on the second insulating layer 350, and a pattern of the conductive connection layer 360 is formed by etching.

It should be noted that the manufacturing process of the array substrate described above is for illustrative purpose only and the present disclosure is not limited thereto.

By referring to the above and the following arrangements of the array substrates of the present disclosure, the ordinary skilled in the art can understand other arrangements of the method of manufacturing an array substrate of the present disclosure.

Figure 4:
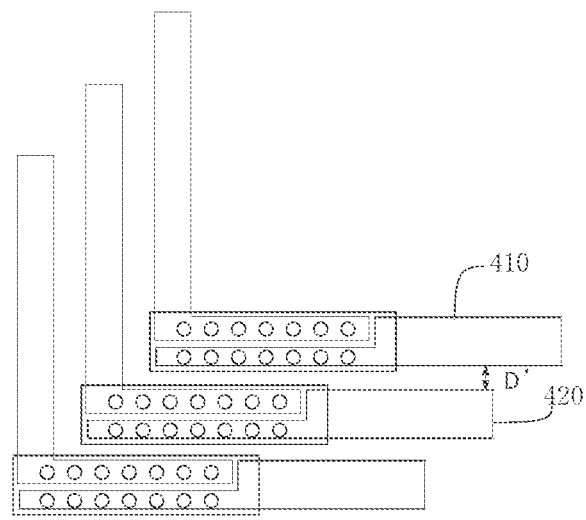
FIG. 4 is a view schematically illustrating an array substrate according to an example arrangement of the present disclosure.

FIG. 4 is a view schematically illustrating an array substrate according to an example arrangement of the present disclosure.

As illustrated in FIG. 4, an array substrate provided by an arrangement of the present disclosure includes a plurality of first signal lines and a plurality of second signal lines and there is a mapping relationship between the respective first signal lines and the respective second signal lines.

The first extension portions of the first signal lines are parallel to each other, for example, in the first direction. The first connection portions of the first signal lines are parallel to each other, for example, in the second direction.

The second extension portions of the second signal lines are parallel to each other, for example, in the second direction. The second connection portions of the second signal lines are parallel to each other, for example, in the second direction.

As can be seen from FIG. 4, the distance D' between two adjacent second signal lines is reduced, such that a compact design of the wiring of the array substrate can be assured, and connection impedance between the signal line and the corresponding signal lead-out line is reduced.

It is shall be understand, explanations are made by taking an example in which the second signal line is a signal line of the array substrate in the above-described arrangement. In other arrangements, when the first signal line is a signal line of the array substrate, similarly, if the above-mentioned array substrate is used, the distance between two adjacent first signal lines is reduced, such that a compact design of the wiring of the array substrate can be assured, and connection impedance between the signal line and the corresponding signal lead-out line is reduced.

Figure 5:
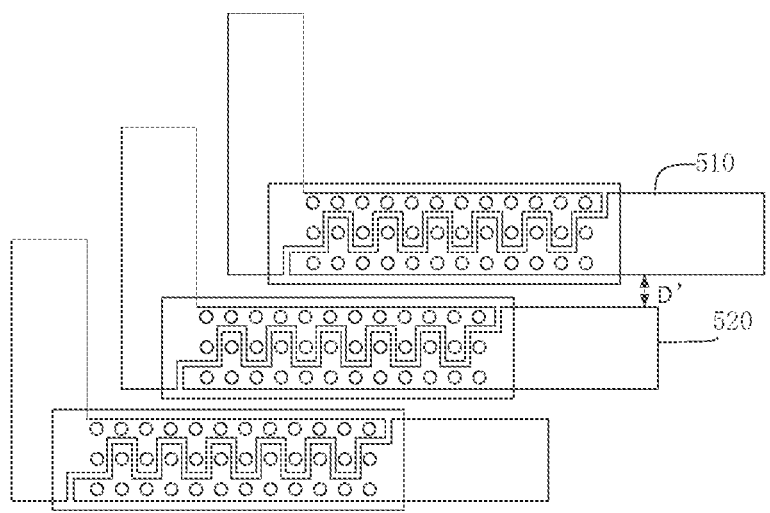
FIG. 5 is a view schematically illustrating an array substrate according to an example arrangement of the present disclosure.

FIG. 5 is a view schematically illustrating an array substrate according to an example arrangement of the present disclosure.

As illustrated in FIG. 5, different from the arrangement illustrated in FIG. 2, a shape of a neighboring boundary between the first connection portion and the second connection portion can be a square wave shape. However, the present disclosure is not limited thereto, and the shape of the neighboring boundary between the first connection portion and the second connection portion can be any one or more of a zigzag shape, an arc shape and an irregular shape.

In the array substrate provided by the arrangement, a length of the neighboring boundary between the first connection portion of the first signal line and the second connection portion of the second signal line is increased by forming the neighboring boundary in the shape as illustrated in FIG. 5. Therefore, it is possible to further reduce the connection impedance between the signal line and its corresponding signal lead-out line and at the same time remain a reduced distance D' between two adjacent signal lines (e.g., adjacent second signal lines 510 and 520), such that a compact design of the wiring of the array substrate can be assured, which is beneficial for the design of the narrow frame of the display panel.

In other arrangements, the shape of the neighboring boundary between the first connection portion and the second connection portion can also be any one or more of a zigzag shape, an arc shape and an irregular shape. Similarly, the length of the neighboring boundary between the first connection portion and the second connection portion can be increased as well, therefore, it is possible to further reduce the connection impedance between the signal line and its corresponding signal lead-out line and at the same time remain a reduced distance D' between two adjacent signal lines, such that a compact design of the wiring of the array substrate can be assured, which is beneficial for the design of the narrow frame of the display panel.

In the arrangement illustrated in FIG. 5, beside increasing the length of the neighboring boundary between the first connection portion and the second connection portion, at the same time, a density of the via holes in the first connection portion and the second connection portion can be correspondingly increased as well.

Figure 6:
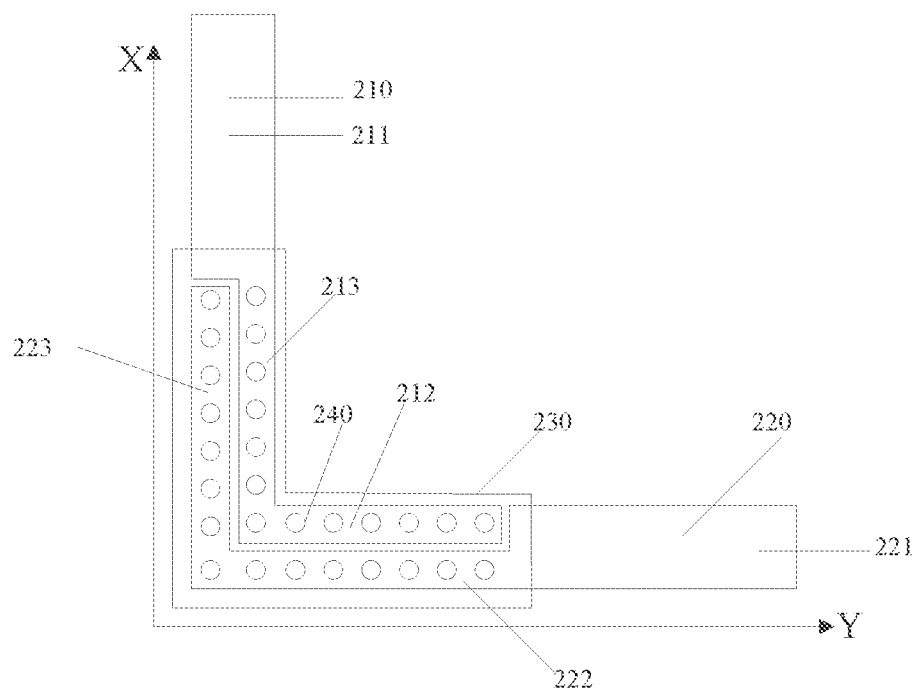
FIG. 6 is a view schematically illustrating an array substrate according to an example arrangement of the present disclosure.

FIG. 6 is a view schematically illustrating an array substrate according to an example arrangement of the present disclosure.

As illustrated in FIG. 6, the difference between the array substrate provided in this arrangement and that in the arrangement illustrated in FIG. 2 lies in that the first signal line 210 can further include a third connection portion 213 in the first direction, which is provided with via holes 240.

The second signal line 220 further includes a fourth connection portion 223 in the first direction, which is provided with via holes 240.

The conductive connection layer 230 is further configured to connect the first signal line 210 and the second signal line 220 through the via holes 240 of the third connection portion 213 and the via holes 240 of the fourth connection portion 223.

The third connection portion 213 and the fourth connection portion 223 are lined up in a direction perpendicular to the first direction.

In an example arrangement, a sum of widths of the third connection portion 213 and the fourth connection portion 223 is not greater than a width of a first extension portion 211.

It should be noted that "width" in the arrangement refers to a width in a direction perpendicular to an extension direction of the first signal line 210.

In an example arrangement, an engaging structure is formed between the third connection portion 213 and the fourth connection portion 223.

In the arrangement illustrated in FIG. 6, the sum of the widths of the third connection portion 213 and the fourth connection portion 223 is approximately equal to the width of the first extension portion 211, and the engaging structure is formed between the third connection portion 213 and the fourth connection portion 223. Therefore, on one hand, the impedance of the lapping region can be reduced to realize the purpose of reducing the impedance; on the other hand, the space D' between two adjacent second signal lines can be further decreased, such that the wiring of the second signal lines can be more compact, which is beneficial for the implementation of the narrow frame of the display panel.

It is to be understood that the sum of the widths of the third connection portion 213 and the fourth connection portion 223 may be smaller than the width of the first extension portion 211 in other arrangements; or the sum of the widths of the third connection portion 213 and the fourth connection portion 223 may be greater than the width of the first extension portion 211, which is not limited by the present disclosure.

In the arrangement illustrated in FIG. 6, the third connection portion 213 is disposed on a first side (e.g. a right side of the fourth connection portion 223 in the figure) of the fourth connection portion 223. In other arrangements, the third connection portion 213 may also be disposed on a second side of the fourth connection portion 223 (e.g. on a left side of the fourth connection portion 223), which is not limited by the present disclosure.

In the array substrate provided by the arrangement of the present disclosure, a length of a boundary between the respective connection portions of the first signal line and the second signal line can be further increased by additionally providing the third connection portion of the first signal line and the fourth connection portion of the second signal line. Therefore, it is possible to further reduce the connection impedance between the signal line and its corresponding signal lead-out line and at the same time remain a reduced distance D' between two adjacent signal lines, such that the wiring of the second signal lines can be more compact, which is beneficial for the implementation of the narrow frame of the display panel.

In other arrangements, similar to the arrangement illustrated in FIG. 5, a shape of the neighboring boundary between the third connection portion and the fourth connection portion in FIG. 6 can be any one or more of a rectangular pulse shape, a zigzag shape, an arc shape and an irregular shape as well. Similarly, the length of the neighboring boundary between the third connection portion and the fourth connection portion can be increased as well, therefore, it is possible to further reduce the connection impedance between the signal line and its corresponding signal lead-out line and at the same time remain a reduced distance D' between two adjacent signal lines, such that the wiring of the second signal lines can be more compact, which is beneficial for the implementation of the narrow frame of the display panel.

The example arrangement further discloses a display panel including the array substrate described in any of the above arrangements.

The display panel has the same technical features and working principles as those of the above array substrate and the above contents have been described in detail, thus details thereof will not be described herein again.

The example arrangement further discloses a display device including the display panel described in any of the above arrangements.

Other arrangements of the present disclosure will be apparent to those skilled in the art from consideration of the specification and practice of the disclosure disclosed here. This application is intended to cover any variations, uses, or adaptations of the present disclosure following the general principles thereof and including such departures from the present disclosure as come within known or customary practice in the art. It is intended that the specification and examples be considered as example only, with a true scope and spirit of the present disclosure being indicated by the following claims.

The example arrangements of the disclosure have been specifically illustrated and described above. It should be understood that the disclosure is not limited to the detailed structures, arrangements or implementations described herein; rather, the disclosure is intended to cover various modifications and equivalents that fall within the spirit and scope of the appended claims.

What is claimed is:

1. An array substrate, comprising:
a first signal line comprising a first extension portion in a first direction and a first connection portion in a second direction, wherein the first connection portion is provided with via holes;
a second signal line comprising a second extension portion and a second connection portion in the second direction, wherein the second connection portion is provided with via holes; and
a conductive connection layer configured to connect the first signal line and the second signal line through the via holes of the first connection portion and the via holes of the second connection portion;
wherein the first connection portion and the second connection portion are lined up in a direction perpendicular to the second direction.

2. The array substrate according to claim 1, wherein a sum of widths of the first connection portion and the second connection portion is not greater than a width of the second extension portion.

3. The array substrate according to claim 1, wherein an engaging structure is formed between the first connection portion and the second connection portion.

4. The array substrate according to claim 3, wherein a shape of a neighboring boundary between the first connection portion and the second connection portion is any one or more of a square wave shape, a zigzag shape, an arc shape and an irregular shape.

5. The array substrate according to claim 1, wherein the first signal line further comprises a third connection portion in the first direction, and the third connection portion is provided with via holes;

the second signal line further comprises a fourth connection portion in the first direction, and the fourth connection portion is provided with via holes;
the conductive connection layer is further configured to connect the first signal line and the second signal line through the via holes of the third connection portion and the via holes of the fourth connection portion; and
the third connection portion and the fourth connection portion are lined up in a direction perpendicular to the first direction.

6. The array substrate according to claim 5, wherein a sum of widths of the third connection portion and the fourth connection portion is not greater than a width of the first extension portion.

7. The array substrate according to claim 5, wherein an engaging structure is formed between the third connection portion and the fourth connection portion.

8. The array substrate according to claim 7, wherein a shape of a neighboring boundary between the third connection portion and the fourth connection portion is any one or more of a square wave shape, a zigzag shape, an arc shape and an irregular shape.

9. The array substrate according to claim 1, wherein the first signal line is a signal line in the array substrate and the second signal line is a signal lead-out line of the corresponding signal line, or the second signal line is a signal line in the array substrate and the first signal line is a signal lead-out line of the corresponding signal line.

10. The array substrate according to claim 9, wherein the first and second signal lines comprise any one of a gate line, a data line, a common electrode line, a clock signal line and a touch line.

11. The array substrate according to claim 1, wherein the first direction is perpendicular to the second direction.

12. A display panel, comprising the array substrate according to claim 1.

13. A display device, comprising the display panel according to claim 12.

14. A method for manufacturing an array substrate, comprising:

depositing a first metal layer on a substrate and forming a first signal line by the first metal layer, wherein the first signal line comprises a first extension portion in a first direction and a first connection portion in a second direction;
depositing a first insulating layer on the first metal layer, depositing a second metal layer on the first insulating layer and forming a second signal line by the second metal layer, wherein the second signal line comprises a second extension portion and a second connection portion in the second direction;
depositing a second insulating layer on the second metal layer, forming via holes of the first connection portion by penetrating the second insulating layer and the second metal layer and forming via holes of the second connection portion by penetrating the second insulating layer; and
depositing a conductive connection layer on the second insulating layer and forming a pattern of the conductive connection layer etching, wherein the first signal line and the second signal line are connected through the via holes of the first connection portion and the via holes of the second connection portion in the pattern;
wherein the first connection portion and the second connection portion are lined up in a direction perpendicular to the second direction.

15. The method for manufacturing an array substrate according to claim 14, wherein a sum of widths of the first connection portion and the second connection portion is not greater than a width of the second extension portion.

16. The method for manufacturing an array substrate according to claim 14, wherein an engaging structure is formed between the first connection portion and the second connection portion.

17. The method for manufacturing an array substrate according to claim 16, wherein a shape of a neighboring boundary between the first connection portion and the second connection portion is any one or more of a square wave shape, a zigzag shape, an arc shape and an irregular shape.

18. The method for manufacturing an array substrate according to claim 14, wherein forming the first signal line further comprises forming a third connection portion in the first direction, and third connection portion is provided with via holes;

forming the second signal line further comprises forming a fourth connection portion in the first direction, and the fourth connection portion is provided with via holes;
forming the conductive connection layer further comprises forming a pattern of the conductive connection layer by etching, wherein the first signal line and the second signal line are connected through the via holes of the third connection portion and the via holes of the fourth connection portion in the pattern; and
the third connection portion and the fourth connection portion are lined up in a direction perpendicular to the first direction.

19. The method for manufacturing an array substrate according to claim 18, wherein a sum of widths of the third connection portion and the fourth connection portion is not greater than a width of the first extension portion.

20. The method for manufacturing an array substrate according to claim 18, wherein an engaging structure is formed between the third connection portion and the fourth connection portion.

* * * * *